(12) United States Patent
Yu et al.

(10) Patent No.: US 12,255,128 B2
(45) Date of Patent: Mar. 18, 2025

(54) SILICON SPACERS WITH IMPROVED ADHESION AND SEMICONDUCTOR DEVICE ASSEMBLIES INCORPORATING THE SAME

(71) Applicant: Micron Technology, Inc., Boise, ID (US)

(72) Inventors: Aibin Yu, Singapore (SG); Yee Chon Chin, Singapore (SG)

(73) Assignee: Micron Technology, Inc., Boise, ID (US)

( * ) Notice: Subject to any disclaimer, the term of this patent is extended or adjusted under 35 U.S.C. 154(b) by 384 days.

(21) Appl. No.: 17/676,037

(22) Filed: Feb. 18, 2022

(65) Prior Publication Data

US 2023/0268263 A1    Aug. 24, 2023

(51) Int. Cl.
| | | |
|---|---|---|
| *H01L 23/498* | (2006.01) | |
| *H01L 21/48* | (2006.01) | |
| *H01L 21/56* | (2006.01) | |
| *H01L 23/31* | (2006.01) | |
| *H01L 25/00* | (2006.01) | |
| *H01L 25/065* | (2023.01) | |
| *H01L 23/00* | (2006.01) | |

(52) U.S. Cl.
CPC .... *H01L 23/49838* (2013.01); *H01L 21/4857* (2013.01); *H01L 21/565* (2013.01); *H01L 23/3121* (2013.01); *H01L 23/3142* (2013.01); *H01L 25/0652* (2013.01); *H01L 25/50* (2013.01); *H01L 24/48* (2013.01); *H01L 24/85* (2013.01); *H01L 2224/48225* (2013.01)

(58) Field of Classification Search
None
See application file for complete search history.

(56) References Cited

U.S. PATENT DOCUMENTS

| | | | |
|---|---|---|---|
| 11,955,462 B2 * | 4/2024 | Seidemann | H01L 25/50 |
| 2022/0059473 A1 * | 2/2022 | Park | H01L 25/0652 |
| 2023/0387080 A1 * | 11/2023 | Hwang | H01L 23/3142 |
| 2024/0047423 A1 * | 2/2024 | Ye | H01L 25/0657 |
| 2024/0063166 A1 * | 2/2024 | Choi | H01L 24/83 |

\* cited by examiner

*Primary Examiner* — Long Pham
(74) *Attorney, Agent, or Firm* — Perkins Coie LLP

(57) ABSTRACT

A semiconductor device assembly is provided. The semiconductor device assembly includes a package substrate and a silicon spacer disposed on an upper surface of the substrate, the silicon spacer having a plurality of trenches extending into the silicon spacer from a top surface thereof. The semiconductor device assembly further includes one or more semiconductor devices disposed over the silicon spacer. Moreover, the semiconductor device assembly includes an encapsulant material at least partially encapsulating the one or more semiconductor devices and the package substrate, the encapsulant material at least partially filling the plurality of trenches of the silicon spacer.

10 Claims, 9 Drawing Sheets

SILICON SPACERS WITH IMPROVED ADHESION AND SEMICONDUCTOR DEVICE ASSEMBLIES INCORPORATING THE SAME

TECHNICAL FIELD

The present disclosure generally relates to semiconductor devices, and more particularly relates to silicon spacers with improved adhesion and semiconductor device assemblies incorporating the same.

BACKGROUND

Microelectronic devices generally have a die (i.e., a chip) that includes integrated circuitry with a high density of very small components. Typically, dice include an array of very small bond pads electrically coupled to the integrated circuitry. The bond pads are external electrical contacts through which the supply voltage, signals, etc., are transmitted to and from the integrated circuitry. After dice are formed, they are "packaged" to couple the bond pads to a larger array of electrical terminals that can be more easily coupled to the various power supply lines, signal lines, and ground lines. Conventional processes for packaging dice include electrically coupling the bond pads on the dice to an array of leads, ball pads, or other types of electrical terminals, and encapsulating the dice to protect them from environmental factors (e.g., moisture, particulates, static electricity, and physical impact).

Figure 1A:
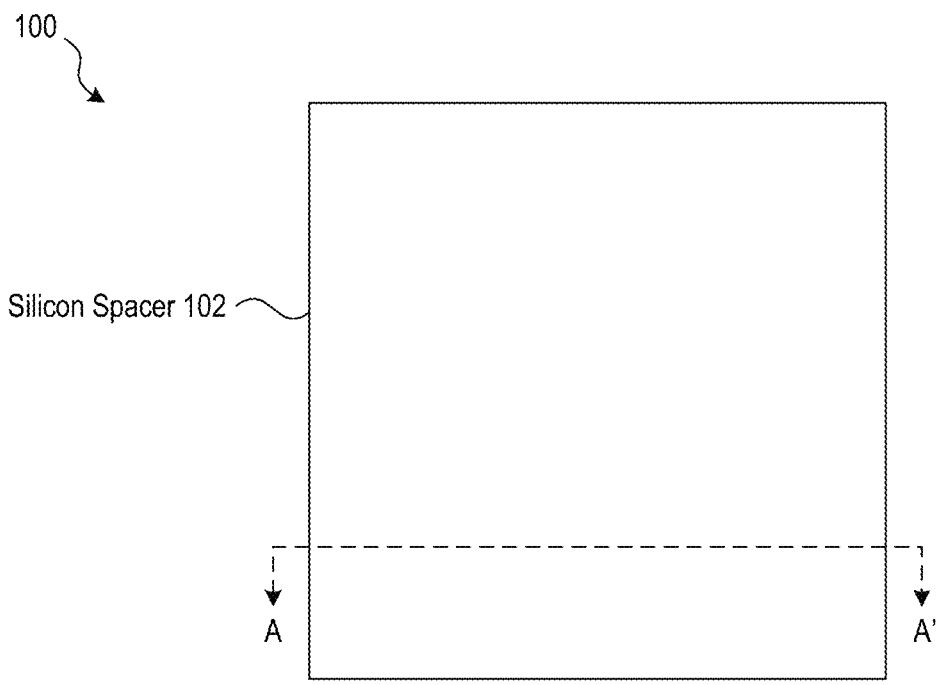
FIG. 1A is a schematic plan view of an example silicon spacer for semiconductor device assembly.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

The demand for smaller and more compact semiconductor devices has led to integrated circuit designs in which components are stacked on top of each other, the stack being disposed on a common package substrate to form an assembly. Conventional assemblies of stacked integrated circuit components may include a silicon spacer that is placed or formed on top of the package substrate (e.g., adjacent a first semiconductor die), with a second semiconductor die placed on top of the silicon spacer (and the first semiconductor die). In addition, the silicon spacer can be put side by side to semiconductor dice. The silicon spacer can enable clearance for wire bond loops that are extended between terminal pad on the package substrate and bond pads located on the first semiconductor die when the second semiconductor die is place thereover, or may be used to provide mechanical support for semiconductor dies with large plan areas being stacked over dies with smaller plan areas. Additional semiconductor dice may be added on the stacked structure, in some cases with each added die being separated from the next lower die by another silicon spacer.

Silicon spacers may help support the semiconductor components in the stacking structure prior to encapsulation, as well as providing aforementioned clearance or standoff for wire bonding loops in establishing electrical connections between the semiconductor components and to a package substrate or other higher level packaging. In addition, silicon spacers may be used in semiconductor device assemblies to balance strip and package warpage for improving packing manufacturing processes yield. The silicon spacers may be formed in a singulation process from a silicon wafer into a designed size.

After the semiconductor device is encapsulated by an encapsulant material, e.g., a molding compound, there is a risk of delamination between the silicon spacer and the encapsulant material. Various methods have been developed to improve the adhesion between the silicon spacer and encapsulant materials. For example, double side grinding has been conducted on both sides of the silicon spacer in order to increase surface roughness of the silicon spacer surfaces and adhesion thereon. In another approach, passivation layer has been applied on the silicon spacer surface to increase the adhesion between the silicon spacer and the encapsulation material. The additional grinding process or passivation layer coating process introduces additional fabrication steps and challenges, and therefore leads to a higher cost of silicon spacer processing for semiconductor device assemblies.

The present disclosure addresses the foregoing challenges, by providing a silicon spacer with trenches extending from a top surface thereof. During semiconductor device assemblies, encapsulant material is filled at least partially into the trenches of the silicon spacer, enhancing a bond and adhesion strength between the silicon spacer and the encapsulant material due to an increased surface contact area therebetween. This configuration of the silicon spacer reduces the delamination risk in the semiconductor device assemblies. Moreover, the trenches of the silicon spacer can be processed by the same technique used in singulating the silicon spacer, at little to no additional cost.

Figure 1B:
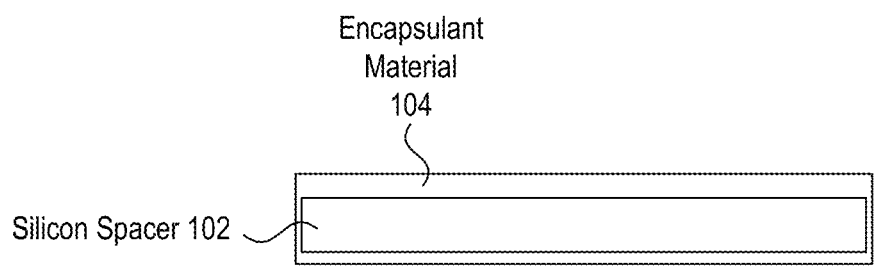
FIG. 1B is a schematic cross-sectional view of the example silicon spacer shown in FIG. 1A.

As can be seen with reference to FIGS. 1A and 1B, when a conventional silicon spacer 102 is encapsulated by an encapsulant material 104, the contact area therebetween is limited to a planar surface area of the silicon spacer. FIG. 1A is a plan view of the encapsulated silicon spacer 102, and FIG. 1B is a cross-sectional view of the encapsulated silicon spacer 102 through the A-A' plane as shown on FIG. 1A. In an example embodiment, the silicon spacer 102 can be singulated from blank silicon wafers into individual silicon spacers using conventional methods used to singulate semiconductor dice. Here, the silicon spacer 102 may be separated along straight lines to form the silicon spacer 102 having square or rectangular shapes in a plan view. In this example, when the silicon spacer 102 is encapsulated by the encapsulant material 104, the risk of delamination is unacceptably high due to the minimal surface areas of contact between the silicon spacer 102 and the encapsulant material 104.

To address these drawbacks and others, various embodiments of the present disclosure provide semiconductor device assemblies in which a plurality of trenches are formed on the silicon spacer. Encapsulant materials can fill into the plurality of trenches to form an increased adhesion strength between the encapsulant material and the silicon spacer. The plurality of trenches can be made by a same technique in processing the silicon spacer to control the production cost.

Figure 2A:
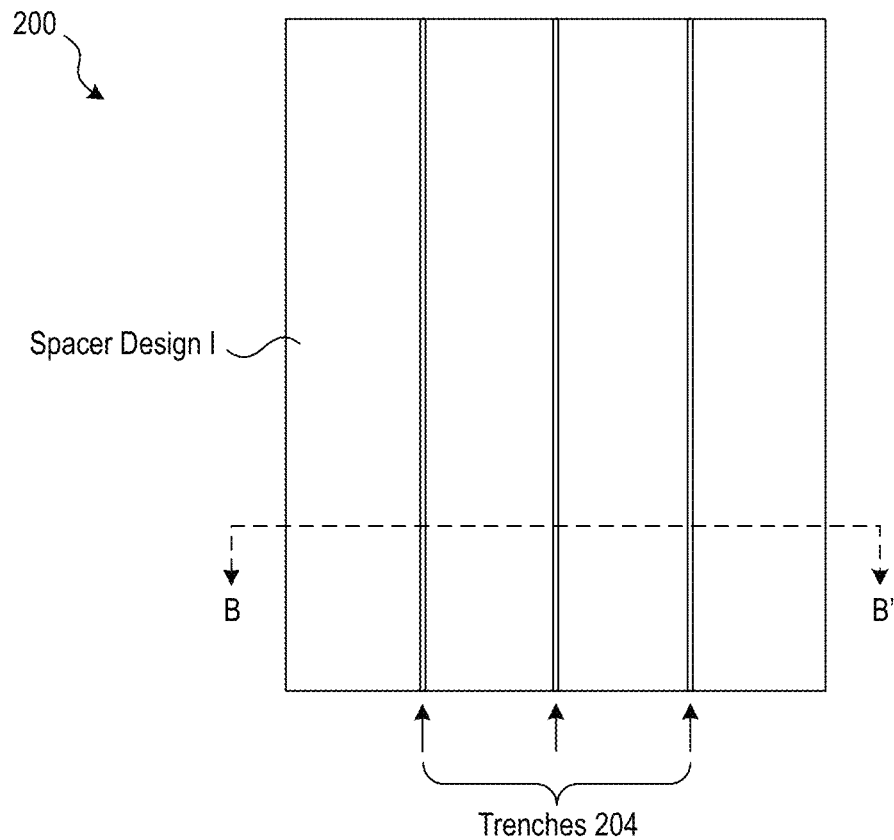
FIG. 2A is a schematic plan view of a silicon spacer for semiconductor device assembly in accordance with embodiments of the present technology.
Figure 2B:
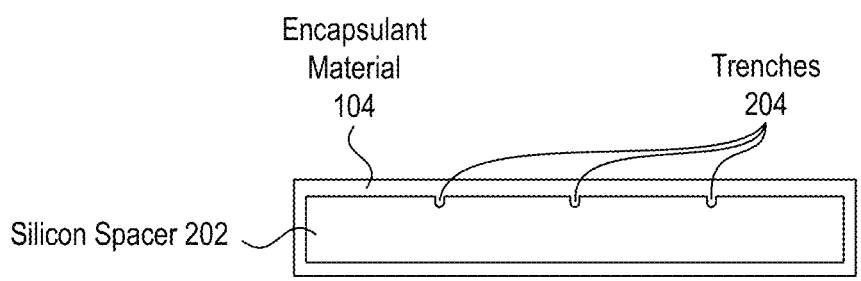
FIG. 2B is a schematic cross-sectional view of the silicon spacer shown in FIG. 2A.

FIGS. 2A and 2B are schematic plan view and cross-sectional view of a silicon spacer for an assembly of semiconductor device in accordance with embodiments of the present technology. As can be seen with reference to FIG. 2A, a silicon spacer 202 is singulated into a rectangular shape from a blank silicon wafer. Specifically, according to a spacer design I, the silicon spacer is further processed to form a group of trenches 204 thereon (e.g., before or after thinning the silicon to a desired thickness). These trenches 204 can be aligned in parallel and with an outer edge of the silicon spacer 202 (e.g., due to a singulating blade making partial-depth passes between saw streets that define the outer edges of the silicon spacer 202).

In this regard, silicon wafers are sliced into individual dice by singulating the silicon wafer along "streets" between the die locations. In accordance with an aspect of the present disclosure, silicon spacers can be similarly singulated from a blank silicon wafer (e.g., in which no semiconductor circuit components have been formed). The same machinery used to hold, transport, and singulate semiconductor dice from processed silicon wafers may be used to hold, transport, and singulate silicon spacers from blank silicon wafers, respectively. In an example embodiment, the trenches 204 can be grooved by the same machinery (e.g., mechanical saws, plasma etching tools, ablating lasers, etc.) used to singulate the silicon spacer 202. In this regard, the silicon spacer 202 can be grooved on its top surface to form trenches 204 with a depth less than a thickness of the silicon spacer 202.

FIG. 2B is a cross-sectional view of the encapsulated silicon spacer 202 through the B-B' plane as shown in FIG. 2A. In an example embodiment, the group of trenches 204 can be grooved from the top surface of the silicon spacer 202 and may have a depth less than the thickness of the silicon spacer 202. In this example, the trenches 204 of the silicon spacer 202 may have a depth ranging from 10 um to 20 um. Further, the group of trenches 204 may have a top opening width on the top surface of the silicon spacer 202 ranging from 10 um to 20 um and a pitch distance ranging from 50 um to 100 um. In this example embodiment, the group of trenches 204 have a rectangular shape in the cross-section view shown in FIG. 2B. In other example embodiments, the trenches of the silicon spacer, including its shape, orientation, size, and pitch distance, can be customized to assist the spacer design of the semiconductor device assemblies.

As shown in the cross-section view of FIG. 2B, the encapsulant material 104 may be completely filled into the trenches 204 of the silicon spacer 202. The filling of encapsulant material 104 into the trenches increases contact area between the encapsulant material 104 and the silicon spacer 202, relative to a planar surface of a same plan dimension on the top surface of the silicon spacer 202, and therefore improves the bond strength therebetween. Here, the enhanced bond strength helps adhere the encapsulant material 104 more firmly on the silicon spacer 202 and reduce the risk of delamination.

In an example embodiment, the trenches 204 can be grooved by a blade cutting technique. As discussed earlier, a same technique can be implemented to singulate the silicon spacer and groove the trenches on the top surface of the silicon spacer. In this example, the blade cutting process is configured to cut through a whole thickness of the blank silicon wafer in order to singulate the silicon spacer 202. In contrary, the blade cutting process can be further controlled to only groove, in parallel with the singulation direction of the silicon spacer 202, the group of trenches 204 on the top surface of the silicon spacer 202. In this example, the silicon spacer design I may firstly singulate the silicon spacer 202, and then groove the group of trenches 204 thereon by shifting the cutting blade from the vertical outer edge of the silicon spacer 202 to a desired trench location above the silicon spacer. Alternatively, the silicon spacer design I can firstly groove the group of trenches 204 on the blank silicon wafer and then singulate the blank silicon wafer. In other example embodiment, the singulating of the silicon spacer and the grooving of the trenches may be performed by a laser cutting technique or a plasma etching technique.

In an example embodiment, the silicon spacer 202 may be directly singulated to a desired size, shape, dimension, and tolerance to assist designs of the semiconductor device assemblies. Further, the encapsulant material, e.g., a molding compound, can be applied on the silicon spacer 202 and become flowable in a high temperature molding process up to 170° C. In this example, the silicon spacer 202 may have a thickness up to 500 um.

Figure 3A:
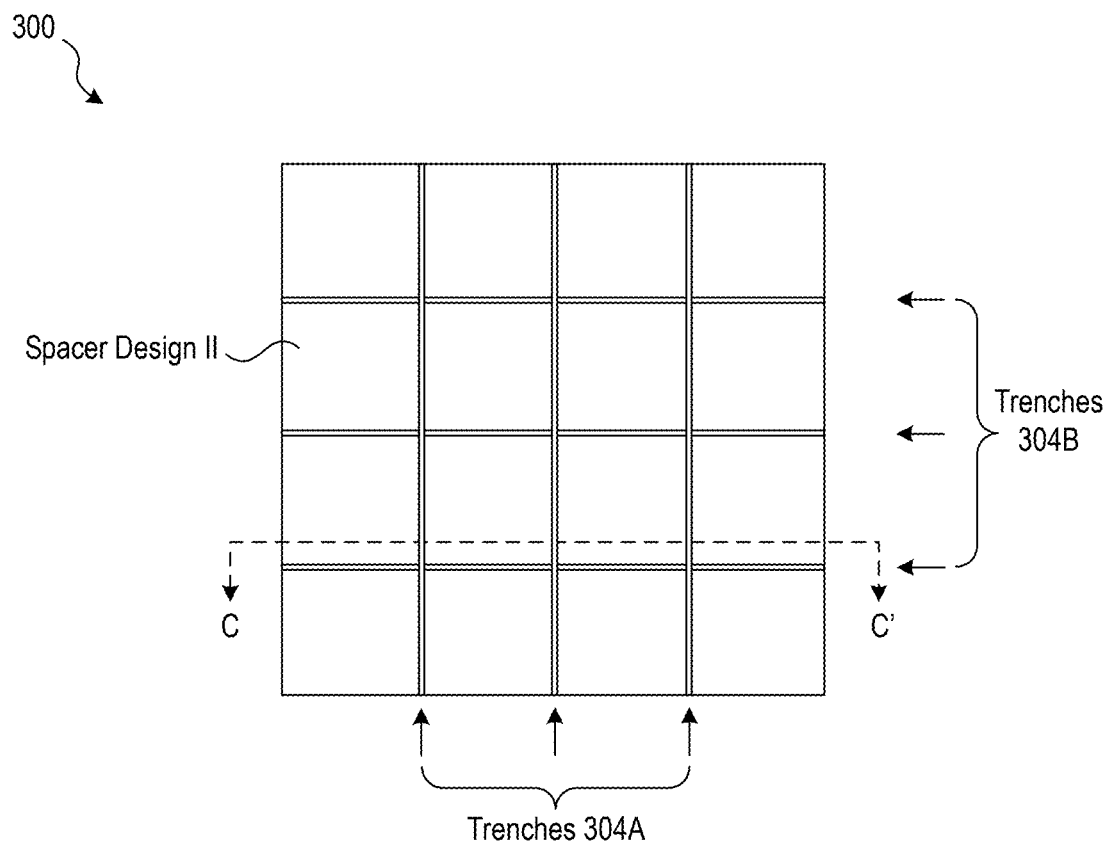
FIG. 3A is a schematic plan view of another silicon spacer for semiconductor device assembly in accordance with embodiments of the present technology.
Figure 3B:
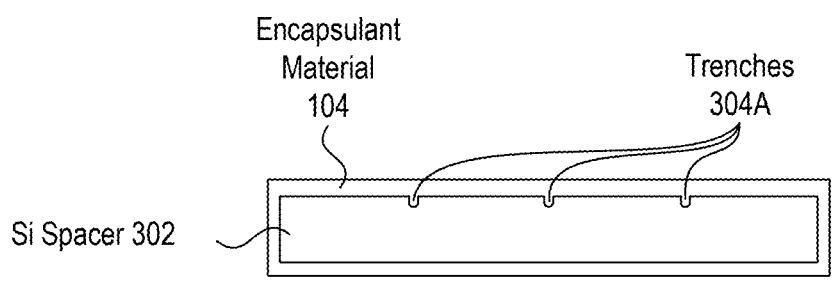
FIG. 3B is a schematic cross-sectional view of the silicon spacer shown in FIG. 3A.

The present disclosure also includes grooving trenches on silicon spacer along various dimensions. FIGS. 3A and 3B are schematic plan view and cross-sectional view of another silicon spacer in an assembly of semiconductor device in accordance with embodiments of the present technology. In an example embodiment, and as shown in the plan view of silicon spacer 302 in FIG. 3A, a first group of trenches 304A and a second group of trenches 304B can be formed on a top surface of the silicon spacer 302. Specifically, the first group of trenches 304A can be grooved along a first vertical outer edge of the silicon spacer 302 and the second group of trenches 304B can be grooved along a second horizontal outer edge of the silicon spacer 302. Similar to the trenches grooving process described in FIGS. 2A and 2B, the first group of trenches 304A and the second group of trenches 304B may be grooved when singulating the silicon spacer 302 to form the first vertical outer edge and the second horizontal outer edge, respectively.

In an example embodiment and as shown in FIG. 3A, the first group of trenches 304A and the second group of trenches 304B can be aligned at a right angle. In another example embodiment, the angle between the first and the second groups of trenches can be customized to assist the spacer design II for assembly of the semiconductor device 300.

FIG. 3B is a cross-sectional view of the encapsulated silicon spacer 302 through the C-C' plane as shown in FIG. 3A. In an example embodiment, the encapsulant material can be filled into the first group of trenches 304A and forms an increased contact area between the encapsulant material 104 and the silicon spacer 302. Similarly, the encapsulant material 104 can be filled into the second group of trenches 304B to further increase the contact area between the encapsulant material 104 and the silicon spacer 302. As compared to the silicon spacer 202 with trenches aligned in a single direction, this spacer design II with multiple groups of trenches aligned along various directions introduces a larger contact area between the encapsulant material 104 and the silicon spacer 302. Therefore, the silicon spacer design II, as well as its trenches 302A and 302B, provides a higher bond/adhesion strength to the encapsulant material 104, compared to the silicon spacer design I shown in FIGS. 2A and 2B.

Figure 3C:
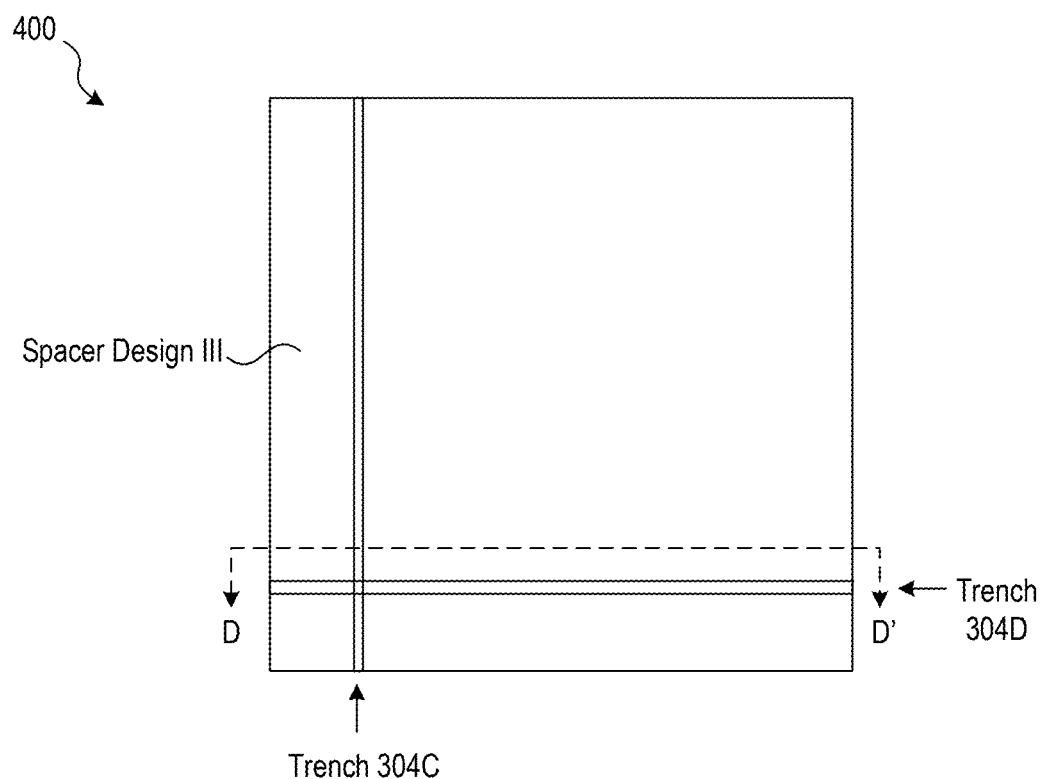
FIG. 3C is a schematic plan view of another silicon spacer for semiconductor device assembly in accordance with embodiments of the present technology.
Figure 3D:
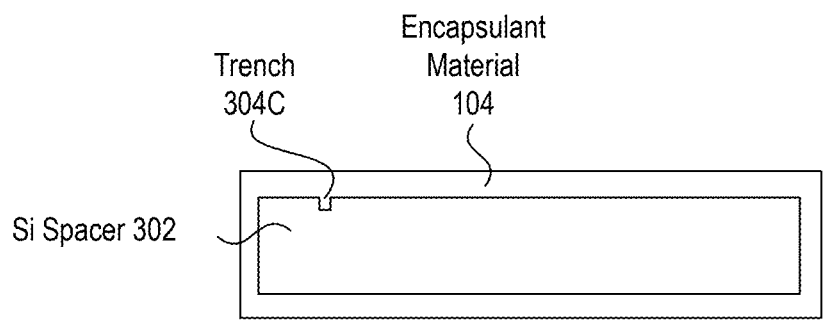
FIG. 3D is a schematic cross-sectional view of the silicon spacer shown in FIG. 3C.

FIGS. 3C and 3D are schematic plan view and cross-sectional view of another silicon spacer in an assembly of semiconductor device in accordance with embodiments of the present technology. In an example embodiment, and as shown in the plan view of silicon spacer 302 in FIG. 3C, a first trench 304C and a second trench 304D can be formed on a top surface of the silicon spacer 302. Specifically, the first trench 304C can be grooved along and close to the first vertical outer edge of the silicon spacer 302 and the second trench 304D can be grooved along and close to the second horizontal outer edge of the silicon spacer 302. Similar to the trenches grooving process described in FIGS. 2A and 2B, the first trench 304C and the second trench 304D may be grooved when singulating the silicon spacer 302 to form the first horizontal outer edge and the second vertical outer edge, respectively. In an example embodiment and as shown in FIG. 3C, the first trench 304C and the second trench 304D can be aligned at a right angle. In another example embodiment, the angle between the first and the second trenches can be customized to assist the spacer design III for assembly of the semiconductor device 400.

FIG. 3D is a cross-sectional view of the encapsulated silicon spacer 302 through the D-D' plane as shown in FIG. 3C. In an example embodiment, the encapsulant material can be filled into the first trench 304C and the second trench 304D to form an increased contact area between the encapsulant material 104 and the silicon spacer 302.

Figure 3E:
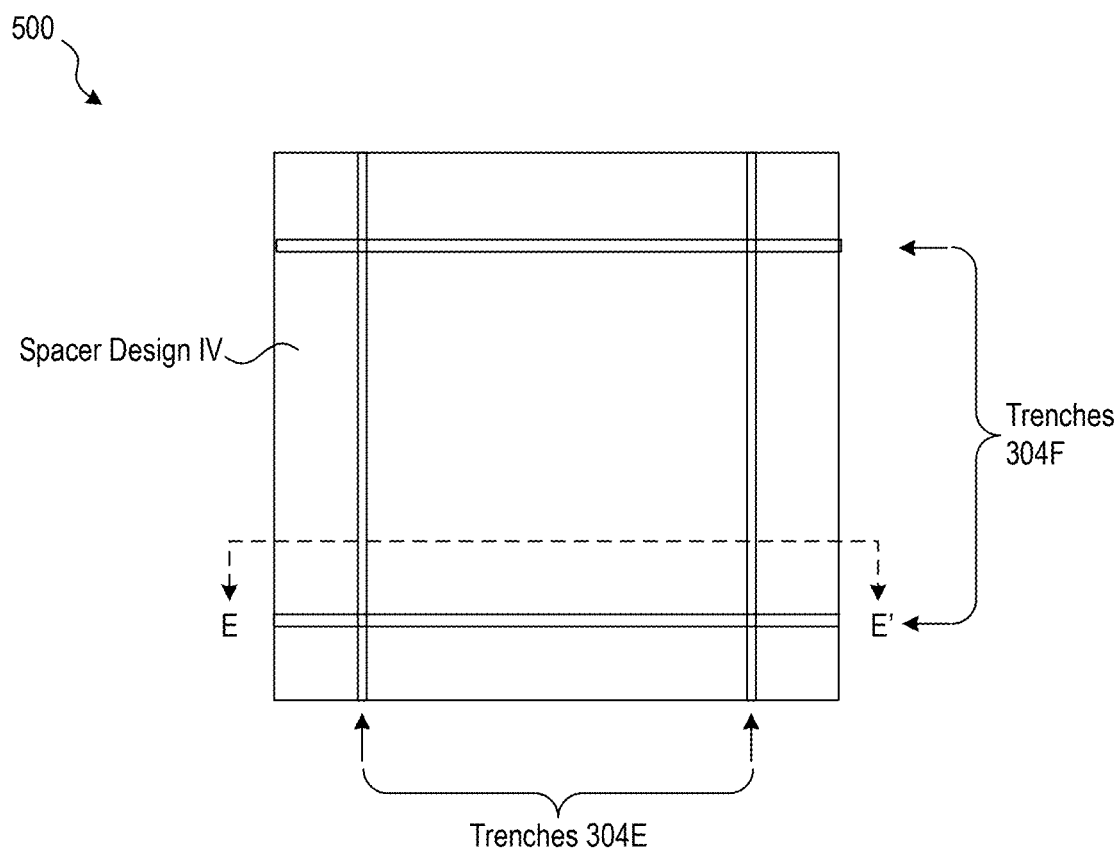
FIG. 3E is a schematic plan view of another silicon spacer for semiconductor device assembly in accordance with embodiments of the present technology.
Figure 3F:
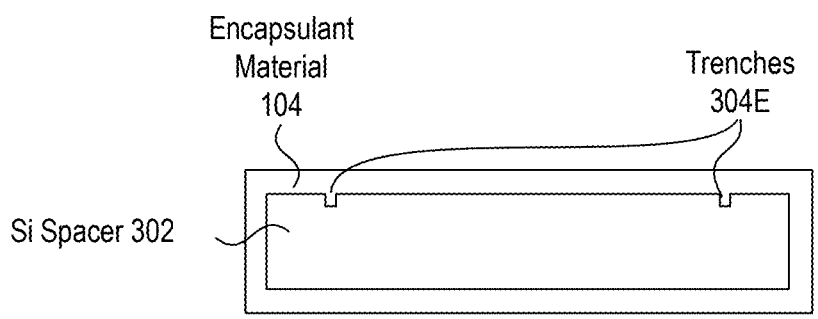
FIG. 3F is a schematic cross-sectional view of the silicon spacer shown in FIG. 3E.

FIGS. 3E and 3F are schematic plan view and cross-sectional view of another silicon spacer in an assembly of semiconductor device in accordance with embodiments of the present technology. In an example embodiment, and as shown in the plan view of silicon spacer 302 in FIG. 3E, a first group of trenches 304E and a second group of trenches 304F can be formed on a top surface of the silicon spacer 302. Specifically, the first group of trenches 304E can be grooved along and close to the first and a third vertical outer edges of the silicon spacer 302 respectively and the second group of trenches 304F can be grooved along and close to the second and a fourth horizontal outer edges of the silicon spacer 302 respectively. Similar to the trenches grooving process described in FIGS. 2A and 2B, the first group of trenches 304E and the second group of trenches 304F may be grooved when singulating the silicon spacer 302 to form the first and third vertical outer edges and the second and fourth horizontal outer edges, respectively.

In an example embodiment and as shown in FIG. 3E, the first group of trenches 304E and the second group of trenches 304F can be aligned at a right angle. In another example embodiment, the angle between the first and the second groups of trenches can be customized to assist the spacer design IV for assembly of the semiconductor device 500.

FIG. 3F is a cross-sectional view of the encapsulated silicon spacer 302 through the E-E' plane as shown in FIG. 3E. In an example embodiment, the encapsulant material can be filled into the first group of trenches 304E and forms an increased contact area between the encapsulant material 104 and the silicon spacer 302. Similarly, the encapsulant material 104 can be filled into the second group of trenches 304F to further increase the contact area between the encapsulant material 104 and the silicon spacer 302.

Although in the foregoing example embodiment semiconductor device assemblies have been illustrated with completely filling of encapsulant materials into the trenches of the silicon spacer, in other embodiments assemblies can be provided with encapsulant material that fills only part way into the vertical sidewall of the silicon spacer trenches (e.g., less than half way up, only two-thirds of the way up, 90% of the way up, etc.). In still other embodiments, in which the spacer is disposed in an assembly with one or more other devices stacked thereon, the trenches may be filled (completely or partially) along only part of their length (e.g., remaining unfilled where covered by another semiconductor device).

Figure 4:
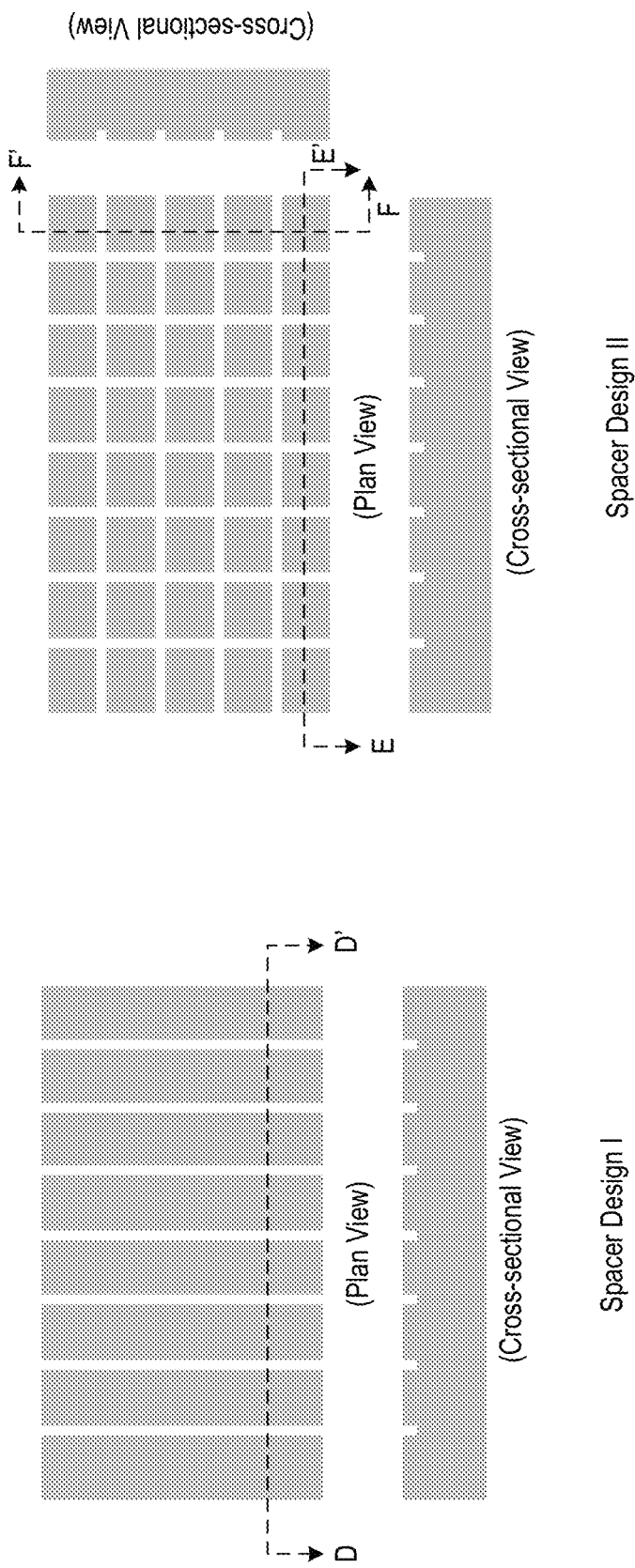
FIG. 4 is a schematic view of various silicon spacer designs in accordance with embodiments of the present technology.

Turning to FIG. 4, various silicon spacer designs are shown in accordance with embodiments of the present technology. The spacer design I reveals silicon spacer with trenches grooved along a first outer edge of the silicon spacer. In addition, the plan view of the spacer design I shown on top reveals increased number of trenches that can be aligned in parallel and reduced trench pitch distance compared to the trenches 204 described in FIGS. 2A and 2B. Moreover, the grooved trenches may have a rectangular shape shown in the cross-sectional view of the silicon spacer on the bottom, through the D-D' plane of this design.

In another example embodiment, as shown in the spacer design II, silicon spacer may be configured to have trenches extending along different outer edges of the silicon spacer. Here, the silicon spacer design II includes a first group of trenches (through the E-E' plane) that can be aligned in parallel with a first outer edge of the silicon spacer. In addition, the silicon spacer also includes a second group of trenches (through the F-F' plane) that can be aligned in parallel with a second outer edge of the silicon spacer. The first and second groups of trenches can be crossed over to form a right angle. In other example embodiments, according to various singulating processes for semiconductor device assemblies, various groups of trenches may form different angles therebetween. Moreover, the number of trenches that are aligned along different outer edges of the silicon spacer can be different. The spacer design II shows more trenches aligned in parallel to the vertical outer edge of the silicon spacer to that are aligned in parallel to the horizontal outer edge of the silicon spacer.

The silicon spacer designs shown in FIG. 4 disclose that the silicon spacers of the present technology, specifically trenches extending on the silicon spacers, can be customized to a desired size, shape, dimension, pitch, and tolerance, in order to assist design of silicon spacer for assembly of semiconductor devices. For example, the silicon spacers may be in a non-rectangular shape, e.g., a triangle shape, a hexagon shape, or a rhombus shape. In another example, the silicon spacers may include trenches that intersect at different angles, e.g., at a 30 degree angle, at a 45 degree angle, or at a 60 degree angle. In another example, the silicon spacers may include groups of trenches that are aligned along more than two directions, e.g., a first group of trenches along a horizontal direction, a second group of trenches along a vertical direction, and a third group of trenches along a direction 45 degree to the horizontal direction. In another example, the silicon spacers may include trenches that are located on both of a front surface and a back surface of the silicon spacers.

Figure 5:
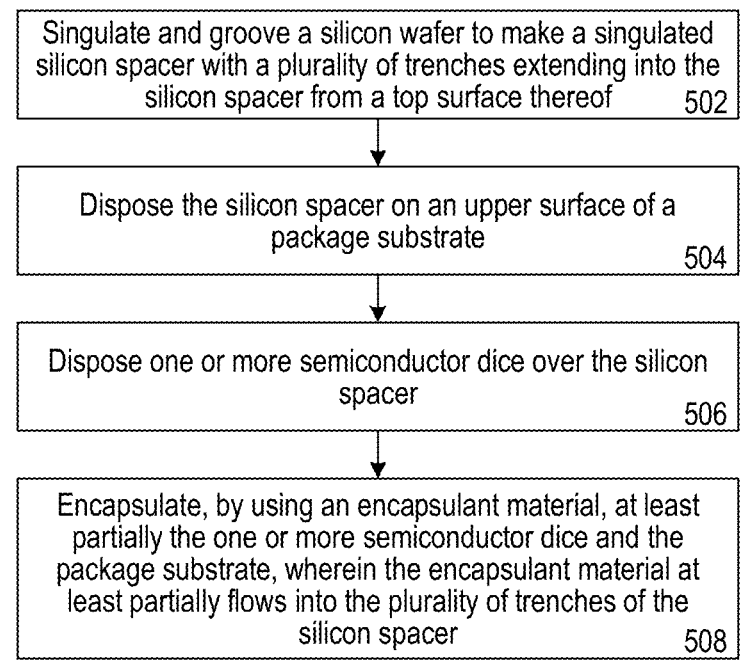
FIG. 5 is a flow chart illustrating a method of making a silicon spacer for semiconductor device assembly in accordance with an embodiment of the present technology.

FIG. 5 is a flow chart illustrating a method 600 of making a silicon spacer for semiconductor device assembly in accordance with an embodiment of the present technology. Referring to FIGS. 2-4, and in an example embodiment, the method 600 includes singulating and grooving a silicon wafer to make a singulated silicon spacer with a plurality of trenches extending into the silicon spacer from a top surface thereof, at 502. For example, the silicon spacer 202 can be singulated into a rectangular shape from a blank silicon wafer. Using a same blade cutting technique, the silicon spacer can be further grooved on its top surface to form a group of trenches 204 within the thickness of the silicon spacer 202. These trenches 202 may be aligned in parallel with an outer edge of the silicon spacer 202.

Further, the method 600 includes disposing the silicon spacer on an upper surface of a package substrate, at 504. For example, once the silicon spacer 202 is singulated and grooved to form trenches 204, it can be disposed on a package substrate. The spacer 202 may be attached on the package substrate by inserting an adhesive layer therebetween.

The method 600 also includes disposing one or more semiconductor dice over the silicon spacer, at 506. For example, after the silicon spacer 202 is disposed on the package substrate, one or more semiconductor dice may be attached on the silicon spacer. According to one aspect of the present disclosure, the clearance enabled by the silicon spacer 202 may allow wire bond loops from bond pads of the one or more semiconductor dice to the terminal pad on the package substrate. In accordance with another aspect, the spacer may provide mechanical support for one or more overlying dice.

Lastly, the method 600 includes at least partially encapsulating, by using an encapsulant material, the one or more semiconductor dice and the package substrate, wherein the encapsulant material at least partially flows into the plurality of trenches of the silicon spacer, at step 508. For example, encapsulant material 104, e.g., a molding compound, may be applied to the stack of the package substrate, the silicon spacer 202, and the one or more semiconductor dice disposed thereon, in a molding process. The encapsulant material 104 may be flowable and fills at least partway into the trenches 202 to form a contact to the top surface of the silicon spacer 202 and the trenches 204 located thereon. The additional contact area between the internal surfaces of the trenches 204 on the silicon spacer 202 increases the adhesion strength between the silicon spacer 204 and the encapsulant material 104, therefore reducing the delamination risk of the semiconductor device assemblies.

Another embodiment of the method 600 for forming a silicon spacer includes grooving trenches into desired size and shape. In other words, the trenches of the silicon spacer may be directly cut to a desired size, shape, dimension, and tolerance using various techniques, rather than using techniques for grooving a silicon spacer or singulating a silicon wafer to silicon spacers. In this regard, trenches may be etched (e.g., via plasma etching, reactive ion etching, etc.) or ablated (e.g., via laser ablation) in the surface of a blank silicon die in any desired shape or arrangement (e.g., non-linear trenches).

Figure 6A:
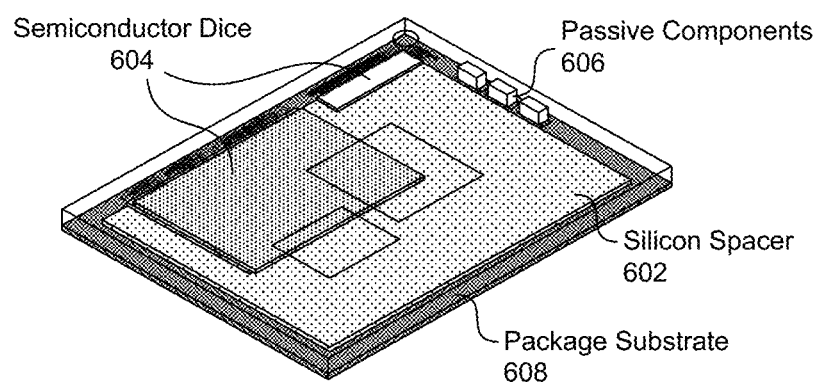
FIG. 6A is a schematic perspective view of a semiconductor device assembly using a silicon spacer in accordance with embodiments of the present technology.
Figure 6B:
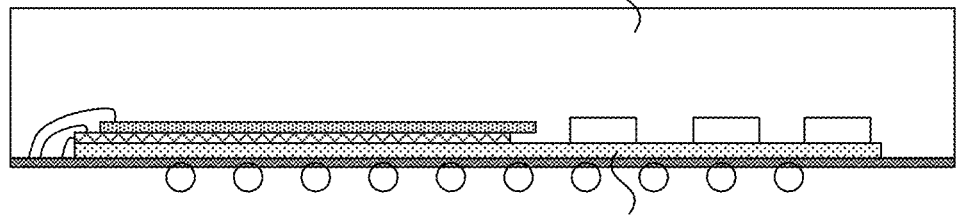
FIG. 6B is a schematic cross-section view of the semiconductor device assembly using a silicon spacer in accordance with embodiments of the present technology.

FIGS. 6A and 6B illustrate a semiconductor device assembly incorporating a silicon spacer in accordance with an embodiment of the present technology. FIG. 6A is a schematic perspective view of a semiconductor device assembly 700 using a silicon spacer 602 with trenches. This semiconductor device 700 includes a package substrate 608, the silicon spacer 602, one or more functional semiconductor dice 604 disposed over the silicon spacer 602, and passive components 606. As discussed in method 600, the silicon spacer 602 is firstly singulated and grooved to form trenches thereon, and then disposed on the package substrate 608. Because the functional semiconductor dice 604 and passive component 606 are disposed above the silicon spacer 602, only a portion of the silicon spacer 602 and trenches is exposed, and therefore less than all of the available trench length may be filled with encapsulant material following encapsulation.

FIG. 6B is a cross-sectional view of the semiconductor device 700, wherein the silicon spacer 602 is disposed on the package substrate 608 and the semiconductor dice 604 are disposed on the silicon spacer 602. Here, the semiconductor device 700 is encapsulated by an encapsulant material 610 in a molding process. Specifically, the encapsulant material 610 fills at least partially into the trenches of the silicon spacer 602, which enhances the adhesion strength between the silicon spacer 602 and the encapsulant material 610 due to an increased contact area therebetween. Since only a portion of the top surface of the silicon spacer 602 is exposed, the encapsulant material 610 may only fill into the exposed trenches on the silicon spacer 602 (depending upon the viscosity/flowability of the liquid encapsulant material prior to curing). Therefore, in some embodiments, areas of the trenches under the semiconductor dice 604 may be substantially free from the encapsulant material 610. The encapsulant material 610 also encapsulates the exposed semiconductor dice 604 and the package substrate 608 for the assembly of the semiconductor device 700.

Figure 6C:
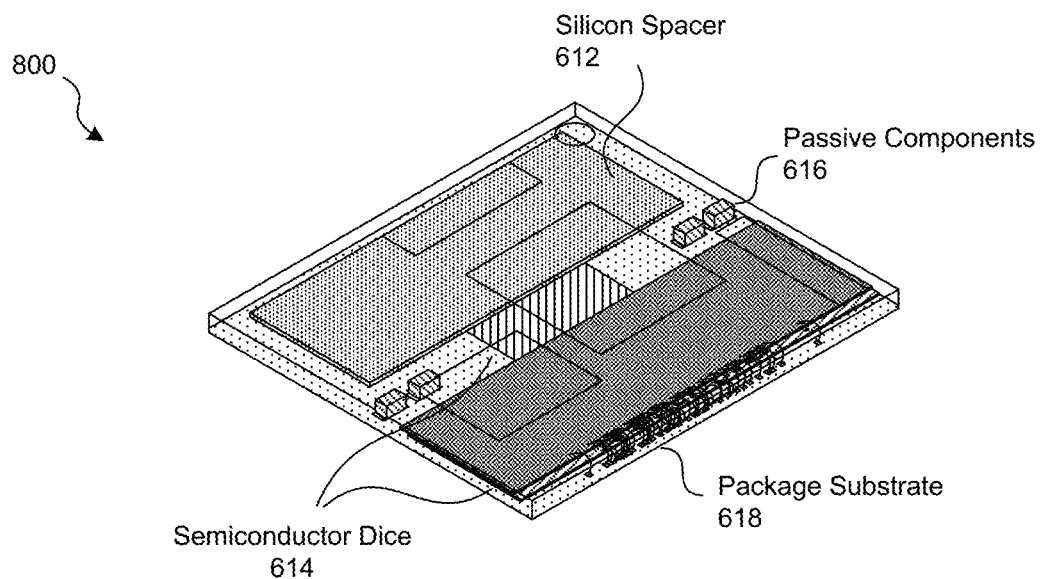
FIG. 6C is a schematic perspective view of another semiconductor device assembly using a silicon spacer in accordance with embodiments of the present technology.
Figure 6D:
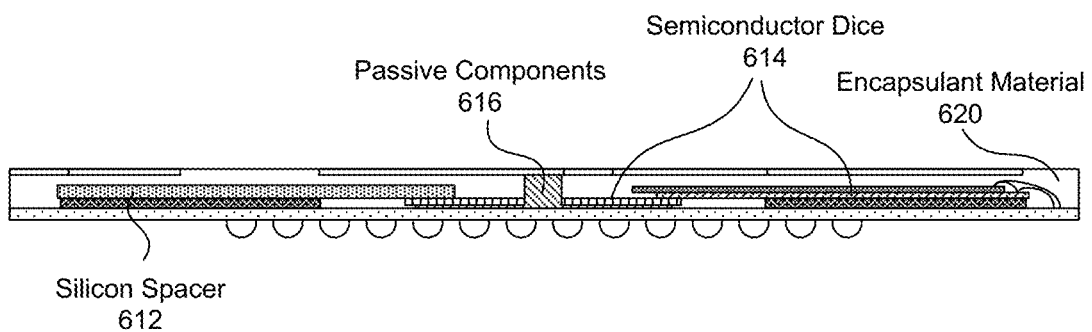
FIG. 6D is a schematic cross-section view of the another semiconductor device assembly using a silicon spacer in accordance with embodiments of the present technology.

FIGS. 6C and 6D illustrate another semiconductor device assembly incorporating a silicon spacer in accordance with an embodiment of the present technology. FIG. 6C is a schematic perspective view of a semiconductor device assembly 800 using a silicon spacer 612 with trenches. This semiconductor device 800 includes a package substrate 618, the silicon spacer 612, one or more functional semiconductor dice 614 disposed side by side to the silicon spacer 612, and passive components 616. As discussed in method 600, the silicon spacer 612 is firstly singulated and grooved to form trenches thereon, and then disposed on the package substrate 618. In this example, the functional semiconductor dice 614 and passive component 616 are disposed side by side to the silicon spacer 612, therefore a whole top surface of the silicon spacer 612 and trenches is exposed.

FIG. 6D is a cross-sectional view of the semiconductor device 800, wherein the silicon spacer 612 is disposed above the package substrate 618 and the semiconductor dice 614 as well as the passive components 616 are disposed side by side of the silicon spacer 612. Here, the semiconductor device 800 is encapsulated by an encapsulant material 620 in a molding process. Specifically, the encapsulant material 620 fills into all trenches of the silicon spacer 612, which enhances the adhesion strength between the silicon spacer 612 and the encapsulant material 620 due to an increased contact area therebetween. The encapsulant material 620 also encapsulates the exposed semiconductor dice 614 and the package substrate 618 for the assembly of the semiconductor device 800.

In an exemplary embodiment, a semiconductor device may include a silicon spacer, a first semiconductor dice, and a second semiconductor dice. The silicon spacer may be disposed next to the first semiconductor dice, both the silicon spacer and the first semiconductor dice being disposed on the package substrate of the semiconductor device. In this example, the second semiconductor dice may be disposed over both of the silicon spacer and the first semiconductor dice. During a molding process, encapsulant material may be filled into a portion of trenches of the silicon spacer that are not covered by the second semiconductor dice.

In another exemplary embodiment, the second semiconductor dice of the semiconductor device may be a stacked memory. In this example, the stacked memory dice may be disposed next to the silicon spacer and the first semiconductor dice, wherein the silicon spacer supports an overhanding portion of the stacked memory dice.

In another exemplary embodiment, the silicon spacer of the semiconductor device may be completed exposed before the molding process, meaning no active layers or semiconductor dices are disposed thereon. In this example, the encapsulant material may be filled into all trenches of the silicon spacer to enhance the adhesion strength therebetween.

Specific details of several embodiments of semiconductor devices, and associated systems and methods, are described above. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly comprising:
a package substrate;
a silicon spacer disposed on an upper surface of the substrate, the silicon spacer having a plurality of trenches extending into the silicon spacer from a top surface thereof;
one or more semiconductor dice disposed over the silicon spacer; and
an encapsulant material at least partially encapsulating the one or more semiconductor dice and the package substrate, the encapsulant material at least partially filling the plurality of trenches of the silicon spacer,
wherein areas of the plurality of trenches under the one or more semiconductor devices are substantially free from the encapsulant material.

2. The semiconductor device assembly of claim 1, wherein the plurality of trenches provide an increased surface area for the encapsulant material to adhere relative to a planar surface of a same plan dimension on the top surface of the silicon spacer.

3. The semiconductor device assembly of claim 1, wherein the one or more semiconductor devices are attached on the silicon spacer.

4. The semiconductor device assembly of claim 1, wherein the plurality of trenches of the silicon spacer have a top opening width ranging from 10 μm to 20 μm, wherein the plurality of trenches of the silicon spacer have a depth ranging from 10 μm to 20 μm, and wherein the silicon spacer has a thickness up to 500 um.

5. The semiconductor device assembly of claim 1, wherein the plurality of trenches have a pitch distance ranging from 50 μm to 100 um.

6. The semiconductor device assembly of claim 1, wherein the encapsulant material includes molding compounds.

7. The semiconductor device assembly of claim 1, wherein the plurality of trenches are aligned in parallel and with one or more outer edges of the silicon spacer.

8. The semiconductor device assembly of claim 7, wherein the plurality of trenches include a first plurality of trenches aligned along a first direction and a second plurality of trenches aligned along a second direction at an angle to the first direction.

9. The semiconductor device assembly of claim 8, wherein the angle is a right angle.

10. The semiconductor device assembly of claim 8, wherein the first direction is parallel to a first outer edge of the silicon spacer and wherein the second direction is parallel to a second outer edge of the silicon spacer.

* * * * *